United States Patent [19]

Neal et al.

[11] 4,129,832
[45] Dec. 12, 1978

[54] METHOD AND MEANS FOR LINEARIZING A VOLTAGE CONTROLLED OSCILLATOR SWEEP GENERATOR

[75] Inventors: Gary W. Neal, Melbourne; Robert M. Montgomery, Indialantic, both of Fla.

[73] Assignee: Harris Corporation, Melbourne, Fla.

[21] Appl. No.: 808,029

[22] Filed: Jun. 20, 1977

[51] Int. Cl.$^2$ ............................................. H03B 23/00
[52] U.S. Cl. ..................................... 331/44; 328/184; 331/178
[58] Field of Search ..................... 331/178, 1 A, 4, 44; 328/184

[56] References Cited
U.S. PATENT DOCUMENTS

| | | | |
|---|---|---|---|
| 3,764,933 | 10/1973 | Fletcher et al. | 331/178 X |
| 4,038,612 | 7/1977 | Borofka et al. | 331/4 X |

*Primary Examiner*—Siegfried H. Grimm
*Attorney, Agent, or Firm*—Robert B. Kennedy

[57] ABSTRACT

A method of linearizing a voltage controlled oscillator wherein a control signal is shaped into ramp form by a memory and transmitted to the control input terminal of a voltage controlled oscillator to be linearized thereby causing the oscillator to generate a chirp. Nonlinearities in the chirp are detected and the memory reprogrammed so as to diminish detected nonlinearities by reshaping the ramp control signal.

A system for linearizing a voltage controlled oscillator is also disclosed having a random access digital control memory coupled with the voltage control terminal of a voltage controlled oscillator to be linearized, a power divider coupled with the output terminal of the oscillator, a mixer coupled with the power divider by two conductive lines of differing time delays, and an x-y axis signal display coupled with the mixer, whereby the memory may be programmed to input a ramp control signal to the oscillator and difference frequency signal detected in the chirp output signal generated by the oscillator and compared with a reference frequency signal on the display to detect nonlinearities in the chirp which may be substantially reduced by reprogramming of the control memory.

9 Claims, 13 Drawing Figures

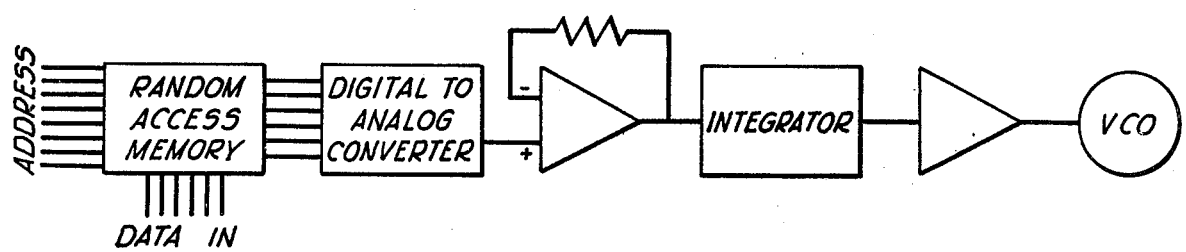
FIG 1
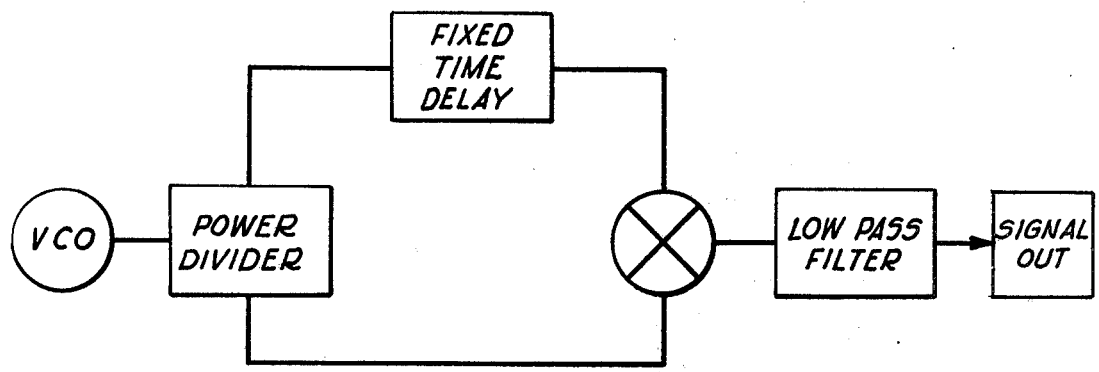
FIG 2
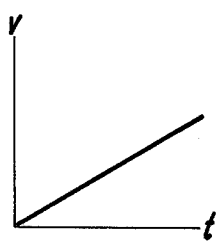   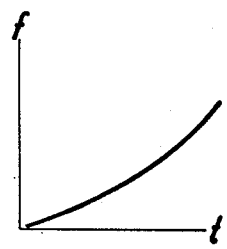   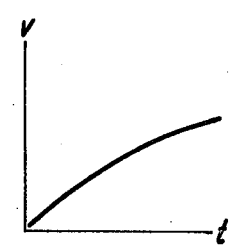
FIG 3        FIG 4        FIG 5
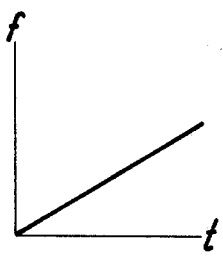   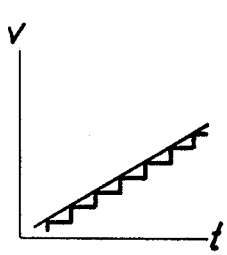   0 0 0 0 0 0
0 0 0 0 0 1
0 0 0 0 1 0
0 0 0 0 1 1
0 0 0 1 0 0
FIG 6        FIG 7        FIG 8

2ND  4TH  6TH  8TH
ADDRESS WORD

METHOD AND MEANS FOR LINEARIZING A VOLTAGE CONTROLLED OSCILLATOR SWEEP GENERATOR

BACKGROUND OF THE INVENTION

This invention relates to methods and means for linearizing voltage controlled oscillators.

Voltage controlled oscillators are today commonly used to generate frequency sweep signals wherein the output signal frequency is continuously varied over a selected frequency range as a function of time. For many applications it is important to have the output frequency signals, which commonly are known as chirps, change at a constant, linear rate.

Heretofore, substantial efforts have been made in developing techniques and control systems for linearizing voltage control oscillators. Exemplary of such prior developments are those disclosed in U.S. Pat. Nos. 3,965,438, 3,931,586, 3,916,335, 3,885,138, 3,872,406, 3,669,448, 3,681,706, 3,621,450, 3,585,525 and 3,582,811. In general, the foregoing approaches have involved monitoring of the sweep frequencies of the voltage-controlled oscillator to be linearized, which frequencies are compared with reference sweep frequencies, and the oscillator control signal reshaped through summing and feedback circuitry in response to the detection of actual and reference frequency variations. Recently, as disclosed in U.S. Pat. No. 3,978,411, an open loop feedback concept has been devised which uses a digital memory, a digital-to-analog converter and an integrator in controlling input voltages to the oscillators for preselected discrete frequency selections for television receivers.

Though the just described techniques have linearized voltage controlled oscillators, their degree of success has been limited. Typically, utilization of these prior art methods and systems have achieved linearization in the range of ±0.5% with the upper limit being approximately ±0.1%. Furthermore, the time involved in performing a linearization operation on individual oscillators has been quite substantial.

Accordingly, it is a general object of the present invention to provide an improved method of linearizing voltage-controlled oscillators.

Another general object of the invention is to provide improved means for linearizing voltage-controlled oscillators.

More specifically, it is an object of the invention to provide a method and means for linearizing voltage-controlled oscillators to a substantially higher degree of linearity than has heretofore been achieved.

Another object of the invention is to provide a method and means for linearizing voltage-controlled oscillators in relatively brief periods of time.

SUMMARY OF THE INVENTION

In one form of the invention a method of linearizing a voltage controlled oscillator is provided wherein a control signal is shaped into ramp form by a memory and transmitted to the control input terminal of a voltage-controlled oscillator to be linearized thereby causing the oscillator to generate a chirp, nonlinearities in the chirp are detected, and the memory reprogrammed so as to diminish the nonlinearities by reshaping the ramp control signal.

In another form of the invention a method of linearizing a voltage-controlled oscillator is provided which comprises the steps of programming a memory to generate a ramp signal, generating and applying the programmed ramp signal to the control input of a voltage-controlled oscillator thereby causing the oscillator to generate a chirp output signal, converting the oscillator chirp output signal to a difference frequency signal indicative of frequency differences of the oscillator chirp output during time intervals of fixed durations, comparing the oscillator difference frequency signal with a reference frequency signal, and reprogramming the memory to bring the oscillator difference frequency signals into closer conformity with the reference frequency signal.

In another form of the invention means are provided for linearizing a voltage-controlled oscillator which comprises, in combination, memory means for programming and recalling preprogrammed ramp control signal data, means for coupling the memory output to the control signal input terminal of a voltage-controlled oscillator to be linearized, and means for detecting nonlinearities in a chirp output signal generated by a voltage-controlled oscillator in response to a control signal inputted to the oscillator from the memory means, whereupon the memory means may be reprogrammed to substantially eliminate detected nonlinearities in the chirp output signal.

In yet another form of the invention a system is provided for linearizing a voltage-controlled oscillator which comprises a random-access digital control memory coupled with the voltage control terminal of a voltage-controlled oscillator to be linearized, a power divider coupled with the output terminal of the oscillator, a mixer coupled with the power divider by two lines of differing time delays, and an x–y axis signal display coupled with the mixer, whereby the memory may be programmed to input a ramp signal to the oscillator and a difference fequency signal detected in the chirp output signal generated by the oscillator and compared with a reference frequency signal on the display to detect nonlinearities in the chirp which may be substantially reduced by programming of the control memory.

BRIEF DESCRIPTION OF THE DRAWING

FIG. 1 is a block diagram of means for generating and applying a ramp control signal to a voltage-controlled oscillator in accordance with the present invention.

FIG. 2 is a block diagram of circuit means for detecting nonlinearities in a chirp output signal of a voltage-controlled oscillator being linearized in accordance with principles of the invention.

FIG. 3 represents a linear ramp control signal being inputted to a voltage-controlled oscillator.

FIG. 4 represents a chirp output signal typically generated by a voltage controlled oscillator in response to the linear control signal illustrated in FIG. 3.

FIG. 5 represents a nonlinear ramp control signal inputted to a voltage-controlled oscillator.

FIG. 6 represents an ideal chirp output signal generated by a voltage-controlled oscillator in response to the input nonlinear control signal illustrated in FIG. 5.

FIG. 7 illustrates a stepped and constant slope ramp control signal generated for input to a voltage controlled oscillator.

FIG. 8 illustrates a sequence of digital numbers inputted into a digital memory to generate a constantly stepped slope ramp control signal for input to an oscillator.

DESCRIPTION OF THE PREFERRED EMBODIMENT

Figure 9:
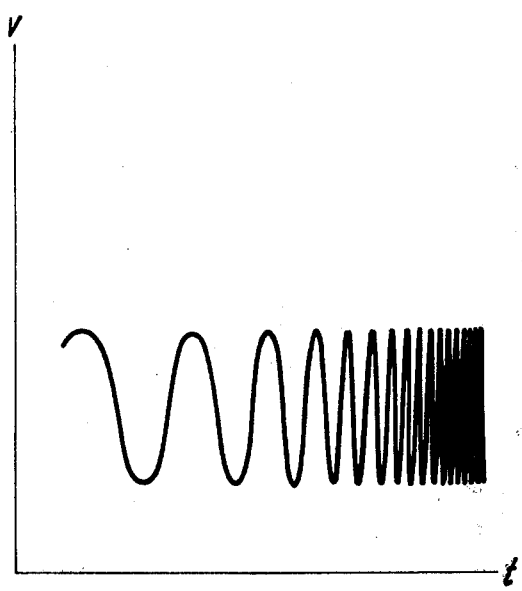
FIG. 9 illustrates a chirp output signal generated by a voltage-controlled oscillator with voltage shown plotted as a function of time.

It is a general characteristic of voltage-controlled oscillators that a linear ramp input signal thereto, as shown in FIG. 3, does not cause the oscillator itself to generate a linear chirp output signal. Rather, such an input signal will cause the oscillator to generate a nonlinear chirp generally of the shape of that shown in FIG. 4 wherein the oscillator sweep output frequency varies as a function of time in a nonlinear manner. Therefore it is necessary to input a control signal whose increases in voltage with respect to time are nonlinear as shown in FIG. 5 in order to cause the oscillator to generate a relative linear output chirp as shown in FIG. 6. This alone, of course, is well known.

With reference to FIGS. 1 and 2, a system for linearizing a voltage-controlled oscillator, or VCO, which embodies principles of the present invention, is seen to include a random access digital memory or RAM having six data input lines and 8 address lines. One commercially available memory suitable for this is Model SN74S201 Bipolar Static RAM marketed by the Texas Instruments Company of Dallas, Tex. The memory itself may be of various constructions. Thus, it may include magnetic bubble elements, charge coupled devices, bipolar transistor circuits or magnetic cores. Obviously, it includes its own power supply for generating output signals for transmitting data. The output of the random access memory is seen to be coupled by six data output lines, one from each of six independent RAMs, to a digital-to-analog converter. A suitable converter here is Model MDP815 sold by Computer Labs, Inc. of Greensboro, N.C. The output from the digital-to-analog converter is coupled through a signal gain amplifier to an integrator. The integrator itself may take the form of an operational amplifier, such as Model HA2505 sold by the Harris Corporation, with a capacitor connected thereacross. The integrator serves to change what without the integrator would be steplike voltage increases in the control signal to the VCO to a smooth, constant slope ramp as shown in FIG. 7. The output of the integrator is connected with the control input terminal of the voltage-controlled oscillator to be tested through a buffer amplifier such as the operational amplifier Model HA2605 which is also sold by the Harris Corporation.

The signal output terminal of the oscillator is coupled to a Merrimac PD-20-110 power divider and then to a mixer through two parallel lines of mutually different time delay. In this case a 270 nsec time delay is introduced into one line while no delay is introduced into the other. The 270 nsec delay line is inserted into the R port of a Relcom M1 type mixer while the undelayed line is inputted into the L port. The signal out from the mixer I port, which yields the product of two input signals, is passed through a low pass filter set at approximately 2 MH$_z$ to filter out the sum frequency and is then applied to the 7A22 vertical amplifier input terminal of a Tektronix oscilloscope.

Figure 10:
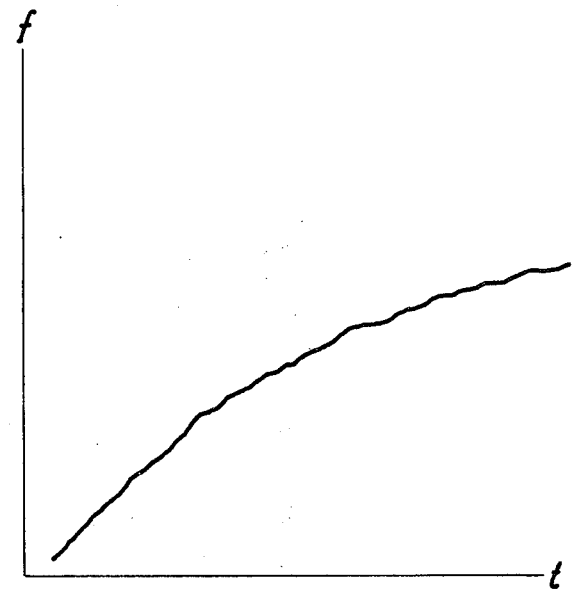
FIG. 10 illustrates a chirp output signal generated by a voltage-controlled oscillator frequency plotted as a function of time.

The circuitry illustrated in FIG. 2 serves to convert the chirp output signal of the oscillator, a direct display of which is too complex to provide linearization information, to a signal which may be displayed as on an oscilloscope and analyzed with relative ease for nonlinearities. FIG. 9 illustrates the chirp output signal generated by one sweep of an oscillator wherein the frequency is seen to increase as a function of time. Were this signal to be displayed on an oscilloscope screen, it would disclose little, if any, information regarding chirp linearity. Thus, as shown in FIG. 10, the chirp illustrated in FIG. 9 may actually contain a number of nonlinearities, both gross and minor. Here the chirp is seen to have a general arcuate shape as well as a number of distinct irregularities.

The purpose of the circuitry illustrated in FIG. 2 is thus to convert the chirp to a signal which can be displayed in a manner so that nonlinearities may be readily observed. Basically, a pair of parallel lines is used to obtain a signal whose frequency is constant when the frequency change of a chirp is constant over a selected time period. Such a signal is created by producing a difference frequency signal with the circuitry of FIG. 2. With this circuitry a sum component will be created in addition to the difference signal which component is removed by the low pass filter.

An explanation of how the just described conversion occurs now follows. The VCO output can be expressed as $A_1 \sin 2\pi \Delta f/\Delta t \, t^2$ where $\Delta f$ is the bandwidth swept by the oscillator, or 160 MHz here. $\Delta t$ is the time required to complete one full frequency sweep or scan. The delayed input is of the form $A_2 \sin 2\pi \Delta f/\Delta t \, t(t-T_D)$ where $T_D$ is 270 nsec. Derivation of the product is as follows:

$$[A_1 \sin 2\pi \frac{\Delta f}{\Delta t} t^2] [A_2 \sin 2\pi \frac{\Delta f}{\Delta t} t(t-T_D)] =$$

$$\frac{A_1 A_2}{2} \cos [2\pi \frac{\Delta f}{\Delta t} t^2 - 2\pi \frac{\Delta f}{\Delta t} t(t-T_D)] -$$

$$\frac{A_1 A_2}{2} \cos [2\pi \frac{\Delta f}{\Delta t} t^2 + 2\pi \frac{\Delta f}{\Delta t} t(t-T_D)] =$$

$$\frac{A_1 A_2}{2} [\cos 2\pi \frac{\Delta f}{\Delta t} t T_D - \cos 2\pi \frac{\Delta f}{\Delta t} t(2t-T_D)]$$

The second term, $(A_1A_2)/2 \cos 2\pi \Delta f/\Delta t \, t(2t-T_D)$ is the sum term, and it is a swept component starting at 320 MH$_z$. This term is not used, but the first term $(A_1A_2)/2 \cos 2\pi \Delta f/\Delta t \, t T_D$ is used. Substituting the values of $\Delta f$, $\Delta t$, and $T_D$ into this expression yields the frequency of this component, which here is 514.28 KH$_z$. It is obvious from the expression $(A_1A_2)/2 \cos 2\pi \Delta f/\Delta t \, T_D t$ that if the ratio $\Delta f/\Delta t$ remains constant, the frequency remains constant, and conversely if the ratio changes, the frequency changes. A constant ratio of $\Delta f/\Delta t$ indicates a linear sweep; therefore regions where the linearity is correct will appear as a constant frequency of 514.28 KH$_z$, here, and nonlinear portions will have other frequencies. There may be regions which are linear but have the wrong ratio of $\Delta f/\Delta t$. The regions willl appear as a fixed frequency, but it will be other than 514.28 KH$_z$.

Figure 13:
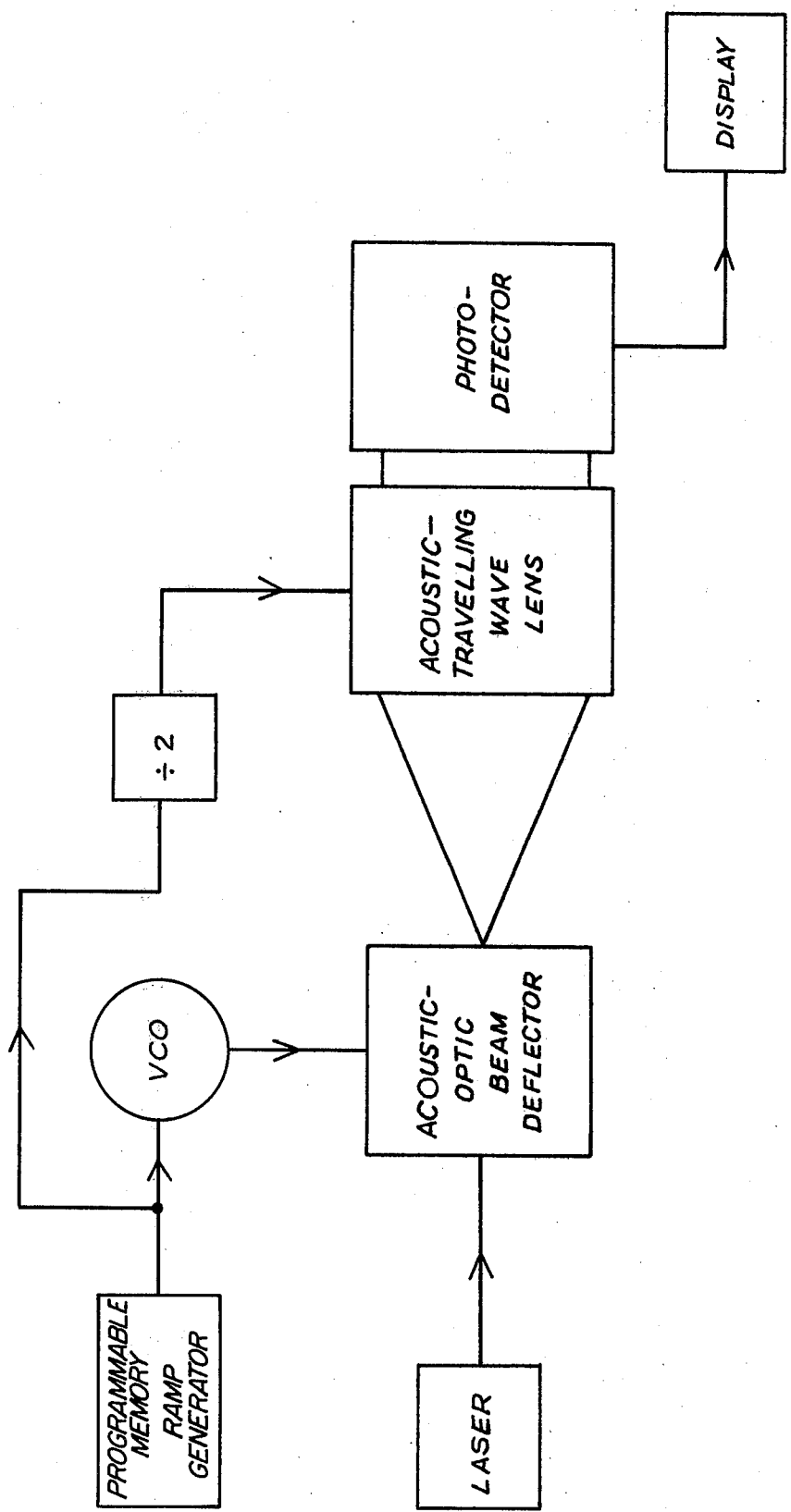
FIG. 13 is a block diagram of means for generating and applying a ramp control signal to a voltage-controlled oscillator in accordance with the present invention in an alternative form wherein chirp nonlinearities are detected by directing a laser beam through an acousto-optic beam deflector driven by oscillator chirps, through an acoustic-travelling wave lens driven on alternate oscillator chirps, and onto a photodetector electrically coupled with an x-y axis display screen.

There are, of course, other methods available for detecting nonlinearities. For example, as shown in FIG. 13, a laser beam may be first passed through an acousto-optic beam deflector driven by VCO chirps, through an acoustic travelling wave lens such as that type disclosed in *Applied Optics*, Vol. 9, No. 9 of September, 1970, and onto an array of fiber optics and to a common photodetector. By dividing the travelling lens trigger by two the travelling lens is not present on alternate scans of the acousto-optic beam deflector. As a result, two superimposed spots will appear on an oscilloscope connected to the photodetector, one of which is focused and one of which is not. The unfocused spot is the laser scan from the deflector while the focused spot is the travelling lens spot. Linearization may then be accomplished by visually aligning the peaks of the two signals.

Figure 11:
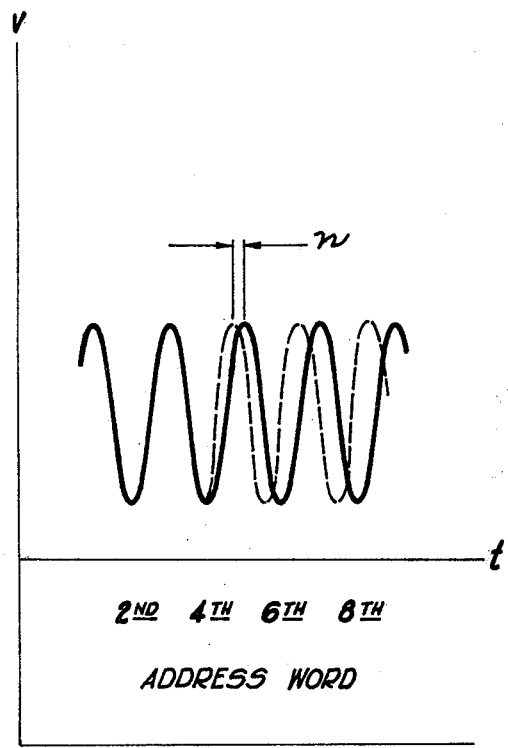
FIG. 11 illustrates a difference frequency generated by a voltage-controlled oscillator to be linearized superimposed upon a reference frequency as displayed by an oscilloscope coupled to the output of the circuit shown in FIG. 2.
Figure 12:
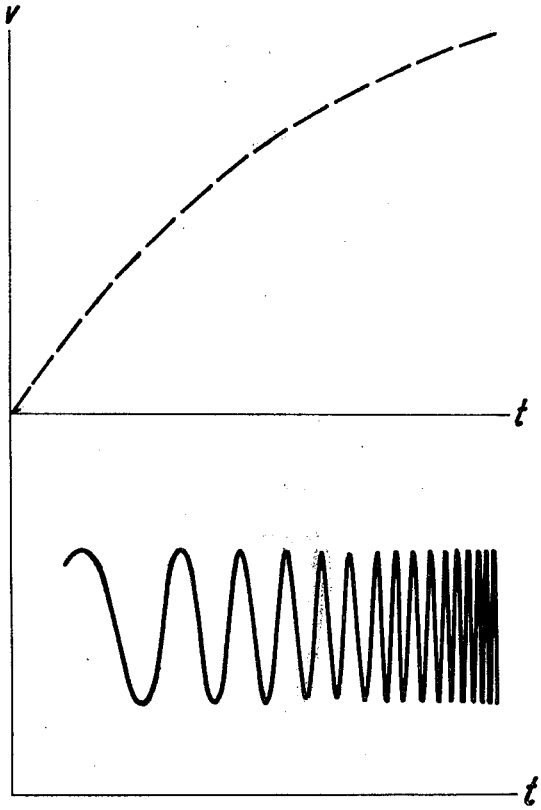
FIG. 12 illustrates, in combination, a control input signal to a voltage-controlled oscillator and resulting linear chirp output signal generated in response thereto by a linearized oscillator.

Once the difference frequency has been obtained it is displayed as shown by the solid curve in FIG. 11. A reference frequency, corresponding to the difference frequency of an ideally linearized oscillator, is superimposed as shown by the broken line. This may be done with a Wavetek sweep generator set at zero band width to generate a constant frequency of 514.28 KH$_z$ which is connected to a second vertical amplifier such as a Tektronix 7A19 plugged into the oscilloscope. The signal generator may be triggered by the same pulse that initiates the oscillator sweeps. In this figure it is seen that the chirp generated by the oscillator under test is linear in the early part of its sweep. Later, however, nonlinearities begin to appear as made visually apparent by the lack of superimposition of the reference and actual difference frequencies. n denotes the first nonlinearity here. Once linearities are observed the RAM is reprogrammed so as to alter portions of its ramp output signal so as to bring the difference frequency of the oscillator chirp into closer conformity with the reference frequency. As shown in FIG. 11 the first nonlinearity n is seen to appear in correspondence with the fifth address word of the RAM. Accordingly, the fifth address word of the RAM is digitally altered until coincidence is observed on the scope. Subsequently successive address words are also altered until the entire sweep has been registered. In this general manner the oscillator is linearized.

One practical procedure to be followed in making the comparison is as follows. Once the apparatus for measuring linearity is connected, the operator uses the delayed sweep on the oscilloscope to expand the time scale of the two superimposed sine waves. The delay vernier is then adjusted to allow viewing of the last 5 to 6 $\mu$sec of the scan. An address corresponding to this location is then entered into the Address switches. The start of the scan corresponds to word 0, and the end of the scan corresponds to word 64. As a result, a point 79 $\mu$sec into the scan will correspond approximately to word 60. Any arbitrary value can then be entered into the Data switches, and the Load button depressed. The effect on the difference frequency can be observed on oscilloscope. The goal is to make the two sine waves coincident. Different data values are tried until an optimum value is found, then the address switches are incremented by one, and another value entered. If the last 5 to 6 $\mu$sec cannot be linearized, a Gain adjustment is made, and linearization again attempted. This procedure is used until the correct Gain setting is determined. After this has been accomplished the operator moves the delay vernier on the oscilloscope until the first portion of the scan is visible. Address 0 is then entered, and data values tried until linearization is accomplished at this location. It may be necessary to adjust the Trigger Level and Trigger Slope controls on the signal generator to obtain time coincidence between the starting points of the two waveforms. The operator then proceeds to sequentially step thru the address, linearizing each of the 64 segments of the scan.

Preferably, the RAM is permanently coupled with the oscillator as shown in FIG. 1 as also is the x-y signal display whereby relinearization may be performed periodically as drift occurs in the chirp. However, such is not essential in that linearization may be performed once as by a manufacturer and a relatively simple, permanently programmed memory left coupled with the VCO. Also, although it obviously is easier to initiate a ramp control signal to the VCO by use of the memory in order to initiate a chirp, other voltage sweep generators could initially be employed with either their signal subsequently altered or replaced by the memory.

We thus see that a method and means for linearizing a sweep generator in the form of a voltage controlled oscillator is disclosed which provides a significant advance in the art. By use of this it has been possible for one man to linearize a wide-band voltage-controlled oscillator generating an output sweep from 160 MH$_z$ to 320 MH$_z$ in 100 $\mu$secs to within $\pm 0.01\%$ linearity in less than one-half hour without difficulty! Considering that heretofore it typically has taken some six hours to obtain $\pm 0.1$ to $\pm 0.5$ linearity, the present invention satisfies a long felt need for an advancement in this art. By linearity herein is meant the maximum phase displacement between the reference and difference frequencies in time divided by the total sweep time.

It should be understood that the just described embodiments merely illustrate principles of the invention in selected preferred forms. Many modifications, additions and delections may, of course, be made thereto without departure from the spirit and scope of the invention as set forth in the following claims.

We claim:

1. A method of linearizing a voltage controlled oscillator comprising the steps of:
   (a) programming a digital memory to generate a ramp signal;
   (b) generating and applying the programmed ramp signal to the control input of a voltage-controlled oscillator by transmitting the ramp signal from the memory in digital form, converting to analog form, and amplifying prior to input into the voltage-controlled oscillator thereby causing the oscillator to generate a chirp output signal;
   (c) converting the oscillator chirp output signal to a difference frequency signal indicative of frequency differences of the oscillator chirp output signal during time intervals of fixed durations; and
   (d) comparing the oscillator difference frequency signal with a reference frequency signal to provide data for reprogramming the memory to bring the oscillator difference frequency signal into closer conformity with the reference frequency signal.

2. A method of linearizing a voltage-controlled oscillator in accordance with claim 1 wherein step (b) the programmed ramp signal in analog form is integrated prior to input into the voltage-controlled oscillator.

3. A method of linearizing a voltage-controlled oscillator comprising the steps of:
   (a) programming a memory to generate a ramp signal;
   (b) generating and applying the programmed ramp signal to the control input of a voltage-controlled oscillator thereby causing the oscillator to generate a chirp output signal;
   (c) converting the oscillator chirp output signal to a difference frequency signal indicative of frequency differences of the oscillator chirp output signal during time intervals of fixed durations;
   (d) comparing the oscillator difference frequency signal with a reference frequency signal by displaying the signals in superimposition; and
   (e) reprogramming the memory to bring the oscillator difference frequency signal into closer conformity with the reference frequency signal.

4. A method of linearizing a voltage-controlled oscillator wherein a control signal is shaped into ramp form by a random access digital memory, converted to analog form, integrated and transmitted to the control input terminal of a voltage-controlled oscillator to be linearized whereby the control signal received at the oscillator control input terminal is of continuously increasing voltage in time and thereby causing the oscillator to generate a chirp; nonlinearities in the chirp are detected; and the memory is reprogrammed so as to diminish the detected non-linearities by reshaping the ramp control signal.

5. A method of linearizing a voltage-controlled oscillator wherein a control signal is shaped into ramp form by a memory and transmitted to the control input terminal of a voltage-controlled oscillator to be linearized thereby causing the oscillator to generate a chirp; nonlinearities in the chirp are detected by directing a laser beam through an acousto-optic beam deflector driven by oscillator chirps, through an acoustic-travelling wave lens driven on alternate oscillator chirps, and onto a photodetector electrically coupled with a x-y axis display screen; and the memory is reprogrammed so as to diminish the detected nonlinearities by reshaping the ramp control signal.

6. A system for linearizing a voltage-controlled oscillator comprising, in combination, a random access digital control memory coupled with the voltage control terminal of a voltage-controlled oscillator to be linearized, a power divider coupled with the output terminal of the voltage-controlled oscillator, a mixer coupled with said power divider by two conductive lines of mutually different time delay, and an x-y axis signal display coupled with said mixer, whereby the memory may be programmed to input a ramp control signal to the oscillator and a difference frequency signal is produced from the chirp output signal generated by the oscillator and compared with a reference frequency signal on the display to detect nonlinearities in the chirp which may be substantially reduced by reprogramming of the control memory.

7. A system for linearizing a voltage-controlled oscillator in accordance with claim 6 wherein said random access digital memory is coupled with the voltage-controlled oscillator serially through an analog-to-digital converter and an integrator.

8. A system for linearizing a voltage-controlled oscillator in accordance with claim 6 wherein said random access digital memory is coupled with the voltage-controlled oscillator through an integrator.

9. A system for linearizing a voltage-controlled oscillator in accordance with claim 6 wherein said x-y axis signal display is an oscilloscope.

* * * * *